(12) United States Patent
Park et al.

(10) Patent No.: US 11,222,575 B2
(45) Date of Patent: Jan. 11, 2022

(54) SHIFT REGISTER AND DISPLAY APPARATUS INCLUDING THE SAME

(71) Applicant: LG Display Co., Ltd., Seoul (KR)

(72) Inventors: YongSeok Park, Paju-si (KR); Hyelim Ji, Incheon (KR)

(73) Assignee: LG Display Co., Ltd., Seoul (KR)

( * ) Notice: Subject to any disclaimer, the term of this patent is extended or adjusted under 35 U.S.C. 154(b) by 166 days.

(21) Appl. No.: 16/131,283

(22) Filed: Sep. 14, 2018

(65) Prior Publication Data
US 2019/0096311 A1 Mar. 28, 2019

(30) Foreign Application Priority Data
Sep. 27, 2017 (KR) .......................... 10-2017-0125004

(51) Int. Cl.
| | |
|---|---|
| G11C 19/00 | (2006.01) |
| G09G 3/20 | (2006.01) |
| G11C 19/28 | (2006.01) |
| G09G 3/36 | (2006.01) |
| G09G 3/3266 | (2016.01) |

(52) U.S. Cl.
CPC ............. *G09G 3/2092* (2013.01); *G09G 3/20* (2013.01); *G09G 3/3266* (2013.01); *G09G 3/3677* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 8,427,206 | B2* | 4/2013 | Yamamoto | H03K 19/01714 |
| | | | | 327/108 |
| 8,649,477 | B2* | 2/2014 | Matsui | H03K 19/018507 |
| | | | | 377/64 |
| 2005/0008114 | A1* | 1/2005 | Moon | G09G 3/3677 |
| | | | | 377/64 |
| 2007/0177712 | A1* | 8/2007 | Yu | G11C 19/28 |
| | | | | 377/64 |

(Continued)

FOREIGN PATENT DOCUMENTS

| | | |
|---|---|---|
| CN | 101097692 A | 1/2008 |
| CN | 101221818 A | 7/2008 |

(Continued)

OTHER PUBLICATIONS

Office Action dated Apr. 22, 2021, issued in corresponding Chinese Patent Application No. 201811124227.1.

(Continued)

*Primary Examiner* — Tuan T Lam
(74) *Attorney, Agent, or Firm* — Morgan, Lewis & Bockius LLP

(57) ABSTRACT

Provided are a shift register and display apparatus including the same. A shift register includes a plurality of stages, each of the plurality of stages including: a node controller configured to: periodically discharge a first node voltage generated from a first driving voltage during a first voltage level of a clock signal, and control a second node voltage opposite to the first node voltage based on a second driving voltage, and an output part configured to receive the clock signal to output an output signal based on the first node voltage.

21 Claims, 7 Drawing Sheets

(56) References Cited

U.S. PATENT DOCUMENTS

| | | |
|---|---|---|
| 2007/0247932 A1 | 10/2007 | Tobita |
| 2008/0002803 A1 | 1/2008 | Kim et al. |
| 2008/0080661 A1 | 4/2008 | Tobita |
| 2010/0097368 A1* | 4/2010 | Hwang ................ G09G 3/3677 345/213 |
| 2010/0226473 A1* | 9/2010 | Liu ........................ G11C 19/28 377/79 |
| 2010/0316182 A1* | 12/2010 | Lai ........................ G11C 19/28 377/79 |
| 2011/0274236 A1* | 11/2011 | Tobita ................... G11C 19/28 377/79 |
| 2012/0188210 A1* | 7/2012 | Zhang ................. G09G 3/3677 345/204 |
| 2012/0269316 A1 | 10/2012 | Jang et al. |
| 2015/0043703 A1* | 2/2015 | Tan ........................ G11C 19/28 377/68 |
| 2015/0116194 A1* | 4/2015 | Matsui ................ G09G 3/3266 345/100 |
| 2015/0279480 A1* | 10/2015 | Murakami ............... G09G 3/20 345/100 |
| 2015/0317954 A1* | 11/2015 | Jang ........................ G09G 3/20 345/213 |
| 2016/0172054 A1* | 6/2016 | Shao .................... G11C 19/184 345/100 |
| 2017/0039987 A1* | 2/2017 | Yao .......................... G09G 3/30 |
| 2019/0108808 A1* | 4/2019 | Lv ........................ G09G 3/3677 |
| 2019/0259350 A1* | 8/2019 | Jeon ..................... G09G 3/3648 |

FOREIGN PATENT DOCUMENTS

| | | |
|---|---|---|
| CN | 102750898 A | 10/2012 |
| CN | 105609138 A | 5/2016 |
| KR | 10-2012-0057108 A | 6/2012 |
| KR | 10-2015-0126286 A | 11/2015 |

OTHER PUBLICATIONS

Office Action dated Nov. 24, 2021, issued in corresponding Korean Patent Application No. 10-2017-0125004.

* cited by examiner

SHIFT REGISTER AND DISPLAY APPARATUS INCLUDING THE SAME

CROSS-REFERENCE TO RELATED APPLICATION(S)

This application claims the benefit of and priority to Korean Patent Application No. 10-2017-0125004, filed on Sep. 27, 2017, the entirety of which is hereby incorporated by reference.

BACKGROUND

1. Technical Field

The present disclosure relates to a shift register and a display apparatus including the same.

2. Discussion of the Related Art

Recently, with the advancement of multimedia, the importance of display apparatuses is increasing. Therefore, flat panel display apparatuses, such as liquid crystal display (LCD) apparatuses, organic light-emitting display apparatuses, and light-emitting diode display apparatuses, are being used practically. The LCD apparatuses and the organic light-emitting display apparatuses, among the flat panel display apparatuses, have good characteristics such as thinness, lightness, and low power consumption. Thus, these devices are being widely used as a display screen for televisions (TVs), notebook computers, and monitors, as well as portable electronic devices, such as electronic notebooks, e-books, portable multimedia players (PMPs), navigation devices, ultra-mobile personal computers (PCs), mobile phones, smartphones, smartwatches, tablet PCs, watch phones, and mobile communication terminals.

LCD apparatuses and the organic light-emitting display apparatuses each include a display panel that includes a plurality of data lines, a plurality of scan lines, a plurality of pixels connected to a corresponding data line and a corresponding scan line, a data driving circuit that supplies data signals to the data lines, and a scan driving circuit including a shift register that supplies a scan signal (or a scan pulse) to the scan lines. Each of the plurality of pixels is supplied with a data signal through a corresponding data line from the data driving circuit in synchronization with the scan pulse through a corresponding scan line from the scan driving circuit, thereby displaying an image corresponding to the data signal.

A related art shift register is configured to not output the scan signal, except for at a time when a predetermined scan signal is output, in one frame. In the related art shift register, a recovery characteristic that is recovered from a stress is not large, and due to this, reliability is reduced. Also, in the related art shift register, an S-factor of a transistor increases due to water that penetrates into the display panel when evaluating reliability against a high temperature and high humidity. As such, a multi-output margin is insufficient. For example, the term "multi-output margin" denotes a margin of a minimum driving voltage for preventing a multi-output in one frame of the scan signal. Therefore, the related art shift register is insufficient in multi-output margin. Therefore, the related art shift register cannot prevent a multi-output in one frame of the scan signal.

SUMMARY

Accordingly, the present disclosure is directed to a shift register and a display apparatus including the same that substantially obviate one or more of the issues due to limitations and disadvantages of the related art.

An aspect of the present disclosure is to provide a shift register and a display apparatus including the same that secure a multi-output margin of a driving voltage by adding a discharge transistor.

Another aspect of the present disclosure is to provide a shift register and a display apparatus including the same, in which a path for discharging a node voltage is added by adding a discharge transistor, thus compensating for a reduction in discharge performance of the shift register, thereby enhancing reliability.

Another aspect of the present disclosure is to provide a shift register and a display apparatus including the same, in which a recovery characteristic against a stress of a transistor is enhanced by adding a discharge transistor, thereby securing a multi-output margin.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a shift register including a plurality of stages, each of the plurality of stages including: a node controller configured to: periodically discharge a first node voltage generated from a first driving voltage during a first voltage level of a clock signal, and control a second node voltage opposite to the first node voltage based on a second driving voltage, and an output part configured to receive the clock signal to output an output signal based on the first node voltage.

In another aspect, there is provided a display apparatus, comprising: a pixel array part comprising a plurality of pixels respectively provided in a plurality of areas defined by a plurality of scan lines and a plurality of data lines; a data driving circuit configured to supply a data signal to each of the plurality of data lines; and a scan driving circuit configured to supply a scan signal to each of the plurality of scan lines, the scan driving circuit comprising a shift register including a plurality of stages, each of the plurality of stages including: a node controller configured to: periodically discharge a first node voltage generated from a first driving voltage during a first voltage level of a clock signal, and control a second node voltage opposite to the first node voltage based on a second driving voltage, and an output part configured to receive the clock signal to output an output signal based on the first node voltage.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
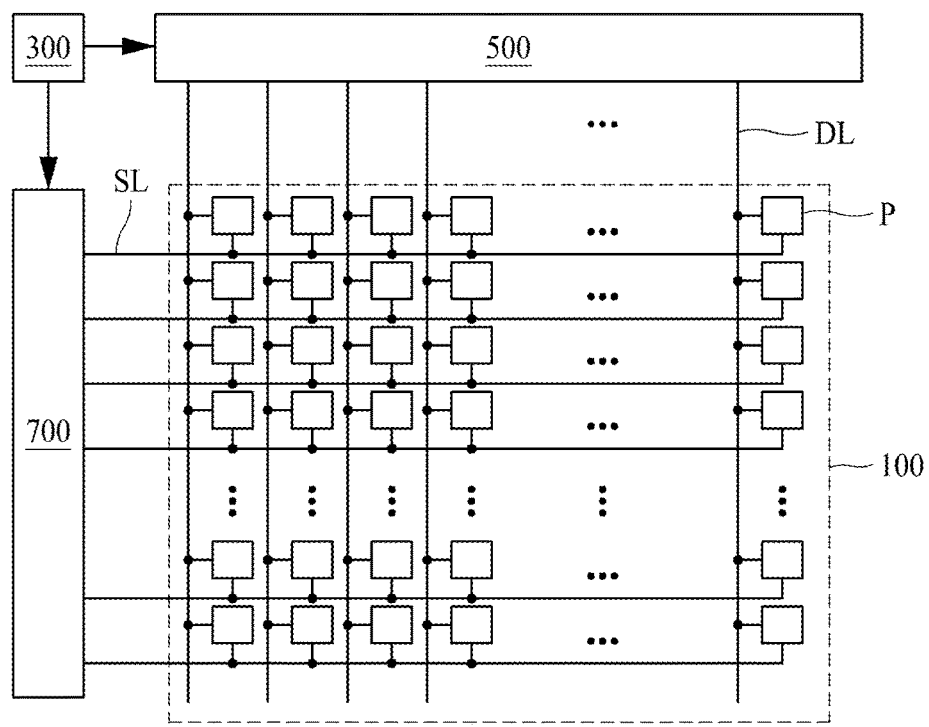
FIG. 1 illustrates a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, embodiments of the present disclosure will be described in detail with reference to the accompanying drawings.

FIG. 1 illustrates a display apparatus according to an embodiment of the present disclosure.

With reference to FIG. 1, a display apparatus may include a pixel array part 100, a control circuit 300, a data driving circuit 500, and a scan driving circuit 700. The pixel array part 100 may include a plurality of scan lines SL and a plurality of data lines DL provided on a substrate, and a plurality of pixels P respectively provided in a plurality of pixel areas defined by intersections of the plurality of scan lines SL and the plurality of data lines DL.

Each of the plurality of pixels P may include a pixel cell (not shown) that may displays an image based on a scan signal supplied through an adjacent scan line SL and a data signal supplied through an adjacent data line DL. For example, the pixel cell may include at least one TFT and at least one capacitor, and may be a liquid crystal cell that may drive liquid crystal according to an electric field based on a data signal to display an image, or may be a self-emitting cell that may self-emit light based on a data signal to display an image. For example, the self-emitting cell may include a plasma discharging element, a quantum dot light-emitting element, an organic light-emitting element, an inorganic light-emitting element, or a micro light-emitting diode. Embodiments are not limited to these examples.

The control circuit 300 may generate pixel data corresponding to each of the plurality of pixels P based on an image signal. The control circuit 300 may generate a data control signal based on a timing synchronization signal, and may supply the data control signal to the data driving circuit 500. According to an embodiment, the control circuit 300 may generate a scan control signal including a plurality of scan clock signals and a start signal based on the timing synchronization signal, and may supply the scan control signal to the scan driving circuit 700. The control circuit 300 may additionally generate a plurality of carry clock signals to supply the plurality of carry clock signals to the scan driving circuit 700 based on a driving manner of the scan driving circuit 700.

The data driving circuit 500 may be connected to the plurality of data lines DL provided in the pixel array part 100. The data driving circuit 500 may receive pixel data and the data control signal supplied from the control circuit 300, and may receive a plurality of reference gamma voltages supplied from a power source circuit. The data driving circuit 500 may convert the pixel data into a pixel-based analog data signal using the data control signal and the plurality of reference gamma voltages, and may supply the pixel-based data signal to a corresponding data line DL.

The scan driving circuit 700 may be connected to the plurality of scan lines provided in the pixel array part 100. The scan driving circuit 700 may generate a scan signal, and may supply the scan signal to a corresponding scan line SL in a predetermined order based on the scan control signal supplied from the control circuit 300. According to an embodiment, the scan driving circuit 700 may include a shift register 710. The shift register 710 will be described in detail below with reference to FIG. 2.

The scan driving circuit 700 according to an embodiment may be integrated in one edge or both edges of the substrate, and may be connected to the plurality of scan lines SL in a one-to-one relationship through a process of manufacturing a TFT. The scan driving circuit 700 according to an embodiment may be provided in an IC, mounted on or the substrate or a flexible circuit film, and may be connected to the plurality of scan lines SL in a one-to-one relationship.

Figure 2:
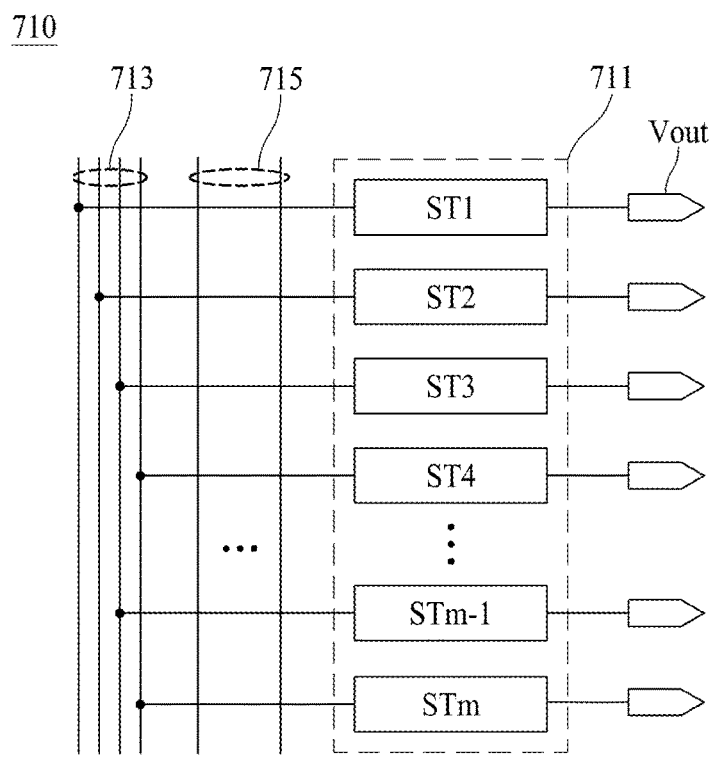
FIG. 2 illustrates a shift register of a scan driving circuit illustrated in FIG. 1.

FIG. 2 illustrates a shift register of a scan driving circuit illustrated in FIG. 1.

With reference to FIG. 2, the shift register 710 may include a stage circuit unit 711, a clock line part 713, and a power line part 715. The stage circuit unit 711 may include a plurality of stages ST1 to STm respectively connected to a plurality of output terminals Vout. For example, each of the plurality of stages ST1 to STm may be enabled in response to an output signal supplied from one of previous stages, and may be reset in response to an output signal supplied from one of next stages. For example, a first stage ST1 may be supplied with a start signal from the outside, instead of an output signal from one of previous stages. A last stage STm may be supplied with a reset signal from the outside, instead of an output signal from one of next stages. Optionally, the start signal may be sequentially supplied to a plurality of stages, and in this case, the reset signal may be sequentially supplied to a plurality of stages. As a result, each of the start signal and the reset signal may be sequentially supplied to two or more stages based on a driving manner of the shift register. According to an embodiment, each of the plurality of stages ST1 to STm may receive a first start signal and a second start signal, and may supply each of the first start signal and the second start signal once in one frame.

The plurality of stages ST1 to STm according to an embodiment may each include a plurality of transistors. For example, the plurality of transistors may each include an oxide semiconductor layer such as zinc oxide (ZnO), indium zinc oxide (InZnO), indium gallium zinc oxide (InGaZnO$_4$), or the like, without being limited thereto. As another example, the plurality of transistors may each include silicon or an organic material, in addition to the oxide semiconductor layer. Also, the plurality of transistors may each be a thin film transistor (TFT).

The clock line part 713 may include a plurality of clock signal lines that may be supplied with a plurality of clock signals having sequentially delayed phases from an external control circuit or a clock generator. The plurality of clock signal lines may be selectively connected to each of the plurality of stages ST1 to STm, and may supply at least one clock signal to each of the plurality of stages ST1 to STm, to match the driving manner of the shift register.

The clock line part 713 according to an embodiment may include a plurality of scan clock signal lines that may respectively receive a plurality of scan clock signals supplied from the external control circuit or the clock generator. Each of the plurality of scan clock signals may include a first period and a second period, which may be repeated at particular intervals. For example, the first period may have a first voltage level for turning on a transistor, and the second period may have a second voltage level for turning off the transistor. The first periods of the plurality of scan clock signals may be sequentially shifted, and at least some of adjacent scan clock signals may overlap. For example, the first period of each of the plurality of scan clock signals may be shifted by units of one horizontal period of a display panel, but may be variously set without being limited thereto. Also, first periods of adjacent scan clock signals may partially overlap.

The clock line part 713 according to an embodiment may further include a plurality of carry clock signal lines, which may respectively receive a plurality of carry clock signals supplied from the external control circuit or the clock generator. Each of the plurality of carry clock signals according to an embodiment may have the same phase as that of each of the plurality of scan clock signals. Each of the plurality of carry clock signals according to an embodiment may overlap the first period of a corresponding scan clock signal of the plurality of scan clock signals in a one-to-one relationship, and a duration of the first period may be longer than a first period of an overlapping scan clock signal.

The power line part 715 may supply various powers, which may be used for selectively outputting the scan clock signal and a gate-off voltage in each of the plurality of stages, to the plurality of stages. The power line part 715 according to an embodiment may include a plurality of power lines that may be supplied with at least one transistor offset voltage, at least one driving voltage, at least one reset voltage, and at least one gate-off voltage from the external control circuit or a power circuit.

Figure 3:
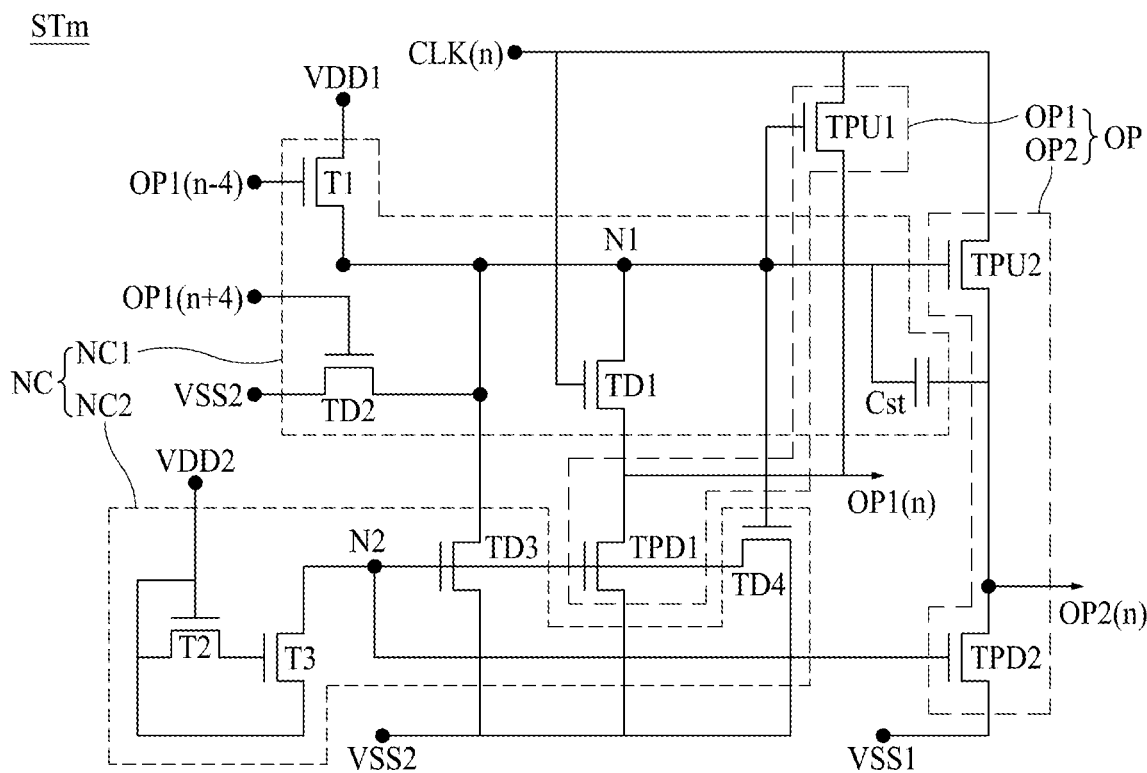
FIG. 3 illustrates a circuit diagram describing a stage of FIG. 2.

FIG. 3 illustrates a circuit diagram describing a stage of FIG. 2.

FIG. 3 illustrates a configuration of an $n^{th}$ stage of a plurality of stages.

In FIG. 3, it is illustrated that each of transistors is configured as an N-type channel transistor, but the transistors according to the present disclosure are not limited to the N-type channel transistor. For example, each of the transistors may be configured as a P-type channel transistor. Hereinafter, an example where each of transistors according to the present disclosure is an N-type channel transistor will be described. Such a description may be construed through modification based on a characteristic of a P-type channel transistor.

With reference to FIG. 3, a stage STm may include a node controller NC and an output part OP. The node controller NC may periodically discharge a first node voltage VN1 generated from a first driving voltage VDD1 during a first voltage level of a clock signal CLK, e.g., CLK(n), and may control a second node voltage VN2 opposite to the first node voltage VN1 based on a second driving voltage VDD2. For example, the node controller NC may include a first node controller NC1 and a second node controller NC2.

The first node controller NC1 may receive the first driving voltage VDD1, and may control the first node voltage VN1 based on a first start signal OP1($n$−4) (where n is a natural number). According to an embodiment, the first start signal OP1($n$−4) may correspond to a first output signal OP1($n$−4) of a fourth front stage STn−4 with respect to a corresponding stage STn. Therefore, an $n^{th}$ stage STn may receive a first output signal OP1($n$−4) of an n−4$^{th}$ stage STn−4 to output a first output signal OP1($n$). Also, the first output signal OP1($n$) output from the $n^{th}$ stage STn may be supplied as a first start signal to an n+4$^{th}$ stage STn+4.

The first node controller NC1 may include a first input transistor T1, a first discharge transistor TD1, a second discharge transistor TD2, and a storage capacitor Cst. The first input transistor T1 may receive the first driving voltage VDD1 from the outside, and may output the first node voltage VN1 based on the first start signal OP1($n$−4). For example, a drain terminal of the first input transistor T1 may be connected to a first driving voltage input part (not shown), supplying the first driving voltage VDD1 of the power line part 715, and a source terminal of the first input transistor T1 may be connected to a first node N1. Also, a gate terminal of the first input transistor T1 may be connected to a first start signal input terminal. For example, the first start signal input terminal may correspond to a first output terminal of a previous stage (or a fourth front stage). Therefore, the first input transistor T1 may be turned on or off based on the first start signal OP1($n$−4). For example, when the first input transistor T1 is turned on, a drain-source current may flow based on a potential difference between the first driving voltage VDD1 and the first node voltage VN1. As a result, when the first input transistor T1 is turned on, the first node N1 may be supplied with the first driving voltage VDD1.

The first discharge transistor TD1 may discharge the first node voltage VN1 based on the clock signal CLK. For example, a drain terminal of the first discharge transistor TD1 may be connected to the first node N1, and a source terminal of the first discharge transistor TD1 may be connected to a first output terminal. Also, a gate terminal of the first discharge transistor TD1 may be connected to a clock terminal and may receive the clock signal CLK. For example, the clock signal CLK may alternately have a first voltage level and a second voltage level during the same period. Therefore, the first discharge transistor TD1 may be turned on or off based on the clock signal CLK. For example, when the first discharge transistor TD1 is turned on, a drain-source current may flow based on a potential difference between the first node voltage VN1 and the first output signal OP1($n$). As a result, when the first discharge transistor TD1 is turned on, the first node voltage VN1 may be discharged.

The second discharge transistor TD2 may discharge the first node voltage VN1 based on a second start signal OP1($n$+4). The second start signal OP1($n$+4) may correspond to a first output signal OP1($n$+4) of a fourth rear stage with respect to a corresponding stage. Therefore, the $n^{th}$ stage STn may receive the first output signal OP1($n$−4) of the n−4$^{th}$ stage STn−4 to receive the first driving voltage VDD1, and may receive a first output signal OP1($n$+4) of the n+4$^t$ stage STn+4 to discharge the first node voltage VN1. Each of the plurality of stages ST1 to STm may receive the first start signal OP1($n$−4) and a second start signal OP1($n$+4), and may supply each of the first output signal OP1($n$) and a second output signal OP2($n$) once in one frame, e.g., one time per frame.

For example, a drain terminal of the second discharge transistor TD2 may be connected to the first node N1, and a source terminal of the second discharge transistor TD2 may be connected to a second low voltage terminal VSS2. For example, the second low voltage terminal VSS2 may correspond to a ground level potential. Also, a gate terminal of the second discharge transistor TD2 may be connected to a second start signal input terminal. For example, the second start signal input terminal may correspond to a first output terminal of a next stage (or a fourth rear stage). Therefore, the second discharge transistor TD2 may be turned on or off based on the second start signal OP1($n$+4). For example, when the second discharge transistor TD2 is turned on, a drain-source current may flow based on a potential difference between the first node voltage VN1 and a second low voltage level VSS2. As a result, when the second discharge transistor TD2 is turned on, the first node voltage VN1 may be discharged, and the second node voltage VN2 opposite to the first node voltage VN1 may have the first voltage level. Also, the second node voltage VN2 may be supplied to a third discharge transistor TD3, and the third discharge transistor TD3 may discharge the first node voltage VN1. In this manner, the shift register 710 may discharge the first node voltage VN1, which may control the second output signal OP2($n$), through each of the first and third discharge transistors TD1 and TD3 and may prevent a multi-output of the second output signal OP2($n$) in one frame. As a result, the shift register 710 may include a plurality of paths for discharging the first node voltage VN1, thereby compensating for a reduction in discharge performance of the shift register 710 and enhancing reliability.

The storage capacitor Cst may be connected to a gate terminal and a source terminal of a second pull-up transistor TPU2 in parallel. For example, one end of the storage capacitor Cst may be connected to the first node N1, and the other end of the storage capacitor Cst may be connected to a second output terminal. Therefore, the storage capacitor Cst may store a voltage between the gate terminal and the source terminal of the second pull-up transistor TPU2. As a result, the storage capacitor Cst may control the first node voltage VN1 based on a potential difference between the first node voltage VN1 and the second output signal OP2($n$). For example, when the storage capacitor Cst stores a certain voltage, and when a voltage of the second output terminal increases, the first node voltage VN1 may increase based on a potential difference between both ends of the storage capacitor Cst.

The second node controller NC2 may receive the second driving voltage VDD2, and may control the second node voltage VN2 based on the second driving voltage VDD2. For example, the second node controller NC2 may include a second input transistor T2, a third input transistor T3, the third discharge transistor TD3, and a fourth discharge transistor TD4.

The second input transistor T2 may receive the second driving voltage VDD2 from the outside, and may supply an input node voltage to a gate terminal of the third input transistor T3 based on the second driving voltage VDD2. For example, a drain terminal and a gate terminal of the second input transistor T2 may be connected to a second driving voltage input part (not shown), supplying the second driving voltage VDD2 of the power line part 715, and a source terminal of the second input transistor T2 may be connected to the gate terminal of the third input transistor T3. Therefore, the second input transistor T2 may be turned on or off based on the second driving voltage VDD2. For example, when the second input transistor T2 is turned on, a drain-source current may flow based on a potential difference between the second driving voltage VDD2 and a gate voltage of the third input transistor T3. As a result, when the second input transistor T2 is turned on, the second input transistor T2 may receive the second driving voltage VDD2 to supply an input node voltage to the gate terminal of the third input transistor T3.

The third input transistor T3 may receive the input node voltage from the second input transistor T2 to output a second node voltage. For example, a drain terminal of the third input transistor T3 may be connected to the second driving voltage input part (not shown), supplying the second driving voltage VDD2 of the power line part 715, and a source terminal of the third input transistor T3 may be connected to a second node N2. Also, a gate terminal of the third input transistor T3 may be connected to the source terminal of the second input transistor T2. Therefore, the third input transistor T3 may be turned on or off based on the input node voltage received from the second input transistor T2. For example, when the third input transistor T3 is turned on, a drain-source current may flow based on a potential difference between the second driving voltage VDD2 and the second node voltage VN2. As a result, when the third input transistor T2 is turned on, the second driving voltage VDD2 may be supplied to the second node N2.

According to an embodiment, the second driving voltage VDD2 may correspond to an even-odd voltage. For example, the second driving voltage VDD2 may include an even voltage VDDE and an odd voltage VDDO. In this case, each of the even voltage VDDE and the odd voltage VDDO may be alternately supplied to the stage STm during at least one frame. For example, the even voltage VDDE may be supplied to the stage STm during one frame, and the odd voltage VDDO may be supplied to the stage STm during the next frame after the one frame. A method of supplying the even voltage VDDE and the odd voltage VDDO is not limited thereto, and may be modified based on a configuration of a plurality of stages and a design configuration of a frame. For example, the second driving voltage VDD2 may prevent a multi-output of the second output signal OP2($n$) in one frame based on a level, and as a minimum level of the second driving voltage VDD2 for preventing the multi-output of the second output signal OP2($n$) may be reduced, a multi-output margin increases in comparison with the related art.

As described above, the shift register 710 may include the first and third discharge transistors TD1 and TD3 and the plurality of for discharging the first node voltage VN1. Thus, a minimum level of the second driving voltage VDD2 for preventing the multi-output of the second output signal OP2($n$) in one frame may be reduced. Therefore, the shift register 710 may enhance a recovery characteristic against a stress of a transistor. Thus, the shift register 710 may secure a multi-output margin of the second driving voltage VDD2, and may compensate for a reduction in discharge performance of the shift register 710, thereby enhancing reliability.

The third discharge transistor TD3 may discharge the first node voltage VN1 based on the second node voltage VN2. For example, a drain terminal of the third discharge transistor TD3 may be connected to the first node N1, and a source terminal of the third discharge transistor TD3 may be connected to a second low voltage terminal VSS2. Also, a gate terminal of the third discharge transistor TD3 may be connected to the second node N2. Therefore, the third discharge transistor TD3 may be turned on or off based on the second node voltage VN2. For example, when the third discharge transistor TD3 is turned on, a drain-source current may flow based on a potential difference between the first node voltage VN1 and a second low voltage level VSS2. As a result, when the third discharge transistor TD3 is turned on, the first node voltage VN1 may be discharged, and the multi-output of the second output signal OP2($n$) may be prevented in one frame.

As described above, the shift register 710 may discharge the first node voltage VN1, which may control the second output signal OP2($n$), through each of the first and third discharge transistors TD1 and TD3, and may prevent the multi-output of the second output signal OP2($n$) in one frame. As a result, the shift register 710 may include the plurality of paths for discharging the first node voltage VN1, thereby compensating for a reduction in discharge performance of the shift register 710 and enhancing reliability.

The fourth discharge transistor TD4 may discharge the second node voltage VN2 based on the first node voltage VN1. For example, a drain terminal of the fourth discharge transistor TD4 may be connected to the second node N2, and a source terminal of the fourth discharge transistor TD4 may be connected to the second low voltage terminal VSS2. Also, a gate terminal of the fourth discharge transistor TD4 may be connected to the first node N1. Therefore, the fourth discharge transistor TD4 may be turned on or off based on the first node voltage VN1. For example, when the fourth discharge transistor TD4 is turned on, a drain-source current may flow based on a potential difference between the second node voltage VN2 and the second low voltage level VSS2. As a result, when the fourth discharge transistor TD4 is turned on, the second node voltage VN2 may be discharged, and the third discharge transistor TD3, which may have been turned on based on the second node voltage VN2, may be turned off.

The output part OP may receive the clock signal CLK, and may output an output signal based on the first node voltage VN1. According to an embodiment, the output part OP may include a first output part OP1 and a second output part OP2.

The first output part OP1 may receive the clock signal CLK, and may supply the first output signal OP1($n$) to another stage based on the first node voltage VN1. For example, the first output signal OP1($n$) of the $n^{th}$ stage STn may be supplied as a second start signal of the fourth front stage STn−4, or may be supplied as a first start signal of the fourth rear stage STn+4. For example, the first output part OP1 may include a first pull-up transistor TPU1 and a first pull-down transistor TPD1.

The first pull-up transistor TPU1 may receive the clock signal CLK, and may supply the first output signal OP1($n$) to the $n^{th}$ stage STn based on the first node voltage VN1. For example, a drain terminal of the first pull-up transistor TPU1 may be connected to a clock terminal to receive the clock signal CLK, and a source terminal of the first pull-up transistor TPU1 may be connected to a first output terminal. Also, a gate terminal of the first pull-up transistor TPU1 may be connected to the first node N1. For example, the clock signal CLK may alternately have the first voltage level and the second voltage level during the same period. Therefore, the first pull-up transistor TPU1 may be turned on or off based on the first node voltage VN1. For example, when the first pull-up transistor TPU1 is turned on, a drain-source current may flow based on a potential difference between the clock signal CLK and the first output signal OP1($n$). As a result, when the first pull-up transistor TPU1 is turned on, the first output signal OP1($n$) may be supplied to the $n^{th}$ stage STn.

The first pull-down transistor TPD1 may discharge the first output signal OP1($n$) based on the second node voltage VN2. For example, a drain terminal of the first pull-down transistor TPD1 may be connected to a first output terminal, and a source terminal of the first pull-down transistor TPD1 may be connected to the second low voltage terminal VSS2. Also, a gate terminal of the first pull-down transistor TPD1 may be connected to the second node N2. Therefore, the first pull-down transistor TPD1 may be turned on or off based on the second node voltage VN2. For example, when the first pull-down transistor TPD1 is turned on, a drain-source current may flow based on a potential difference between the first output terminal and the second low voltage level VSS2. As a result, when the first pull-down transistor TPD1 is turned on, the first output signal OP1($n$) may be discharged. Therefore, when the first pull-up transistor TPU1 is turned on, a first output terminal of the first output part OP1 may output the first output signal OP1($n$), and when the first pull-down transistor TPD1 is turned on, the first output terminal of the first output part OP1 may have the second low voltage level VSS2.

The second output part OP2 may receive the clock signal CLK, and may supply the second output signal OP2($n$) to a scan line SL based on the first node voltage VN1. For example, the second output part OP2 may include a second pull-up transistor TPU2 and a second pull-down transistor TPD2.

The second pull-up transistor TPU2 may receive the clock signal CLK and may supply the second output signal OP2($n$) having the first voltage level based on the first node voltage VN1. For example, the second output signal OP2($n$) may correspond to a scan signal supplied to the scan line SL of the pixel array part 100, and when the second output signal OP2($n$) has the first voltage level, the second output signal OP2($n$) may turn on a transistor of a pixel of the pixel array part 100. For example, a drain terminal of the second pull-up transistor TPU2 may be connected to the clock terminal to receive the clock signal CLK, and a source terminal of the second pull-up transistor TPU2 may be connected to a second output terminal. Also, a gate terminal of the second pull-up transistor TPU2 may be connected to the first node N1. Therefore, the second pull-up transistor TPU2 may be turned on or off based on the first node voltage VN1. For example, when the second pull-up transistor TPU2 is turned on, a drain-source current may flow based on a potential difference between the clock signal CLK and the second output signal OP2($n$). As a result, when the second pull-up transistor TPU2 is turned on, the second output signal OP2($n$) having the first voltage level may be supplied to the scan line SL of the pixel array part 100.

The second pull-down transistor TPD2 may supply the second output signal OP2($n$) having the first voltage level VSS1 based on the second node voltage VN2. For example, the second output signal OP2($n$) may correspond to the scan signal supplied to the scan line SL of the pixel array part 100, and when the second output signal OP2($n$) has the first voltage level VSS1, the second output signal OP2($n$) may turn on the transistor of the pixel of the pixel array part 100. For example, a drain terminal of the second pull-down transistor TPD2 may be connected to the second output terminal, and a source terminal of the second pull-down transistor TPD2 may be connected to the first output terminal VSS1. Also, a gate terminal of the second pull-down transistor TPD2 may be connected to the second node N2. Therefore, the second pull-down transistor TPD2 may be turned on or off based on the second node voltage VN2. For example, when the second pull-down transistor TPD2 is turned on, a drain-source current may flow based on a potential difference between the second output terminal and the first output terminal VSS1. As a result, when the second pull-down transistor TPD2 is turned on, the second output signal OP2($n$) having the first voltage level VSS1 may be supplied to the scan line SL of the pixel array part 100.

Figure 4:
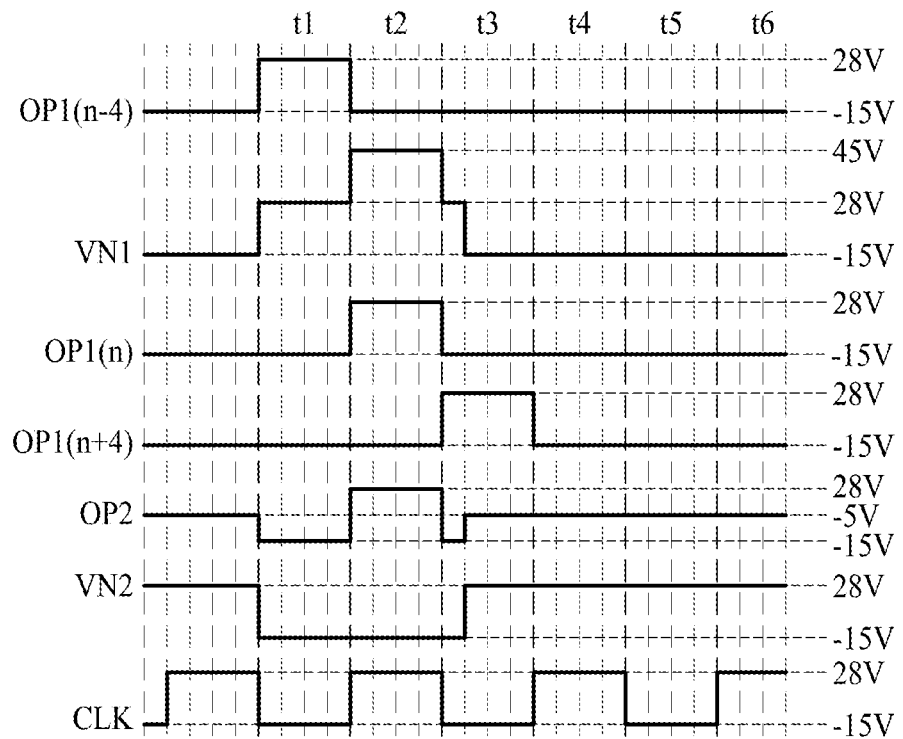
FIG. 4 illustrates a driving waveform diagram of the stage of FIG. 3.

FIG. 4 illustrates a driving waveform diagram of the stage of FIG. 3.

For example, FIG. 4 shows a level waveform diagram of a signal and a node in the stage STm during a plurality of periods t1 to t6. Also, the following Table 1 shows a voltage level of each of the gate terminal, the source terminal, and the drain terminal of the first discharge transistor TD1 and the turn-on or not of the first discharge transistor TD1 during a plurality of periods t1 to t6.

TABLE 1

| | t1 | t2 | t3 | t4 | t5 | t6 |
|---|---|---|---|---|---|---|
| Gate terminal [V] | −15 | 28 | −15 | 28 | −15 | 28 |
| Source terminal [V] | −15 | 28 | −15 | −15 | −15 | −15 |
| Drain terminal [V] | 28 | 45 | −15 | −15 | −15 | −15 |
| Gate-Source voltage [V] | 0 | 0 | 0 | 43 | 0 | 43 |
| Turn-on or not | Turn-off | Turn-off | Turn-off | Turn-on | Turn-off | Turn-on |

For example, the gate terminal of the first discharge transistor TD1 described in Table 1 may be connected to the clock terminal to receive the clock signal CLK, the source terminal of the first discharge transistor TD1 may be connected to the first output terminal, and the drain terminal of the first discharge transistor TD1 may be connected to the first node N1. Also, the first discharge transistor TD1 may receive the clock signal CLK through the gate terminal. When a gate-source voltage has a particular level (for example, 43 V) or more, the first discharge transistor TD1 may be turned on. Therefore, when the clock signal CLK has the first voltage level (for example, 28 V) and the first output signal OP1(n) has the second voltage level (for example, −15 V), the first discharge transistor TD1 may periodically discharge the first node voltage VN1. The voltage levels used herein are merely non-limiting examples.

With reference to FIG. 4 and Table 1, the stage STm may include a plurality of periods during one frame. For example, one period may denote a minimum period in which the clock signal CLK maintains the first voltage level or the second voltage level (or the second low voltage level). For example, the first voltage level may correspond to 28 V, the first low voltage level may correspond to −15 V, and the second voltage level (or the second low voltage level) may correspond to −15 V. A particular value of each of the first voltage level, the first low voltage level, and the second low voltage level may be changed based on the device characteristic and design characteristic of a display apparatus without being limited to the above-described examples, which are provided for convenience of explanation.

The first start signal OP1(n−4) may have the first voltage level (e.g., 28 V) during a first period t1, and during the other period t1, may have the second voltage level (e.g., −15 V). For example, the first start signal OP1(n−4) may correspond to the first output signal OP1(n−4) output from the fourth front stage STn−4 with respect to the corresponding stage STn. The first start signal OP1(n−4) may be supplied to the gate terminal of the first input transistor T1 of the first node controller NC1.

The first node N1 may be connected to the source terminal of the first input transistor T1, and may have the first node voltage VN1 based on a drain-source current flowing in the first input transistor T1. For example, when the first input transistor T1 is turned on based on the first start signal OP1(n−4) during the first period t1, the first node voltage VN1 may have the first voltage level (e.g., 28 V) based on the first driving voltage VDD1. For example, the first driving voltage VDD1 may correspond to a direct current (DC) voltage having a voltage level of, e.g., 28 V. The first node N1 may be connected to the gate terminal of each of the first and second pull-up transistor TPU1 and TPU2, and the first node voltage VN1 may turn on or off each of the first and second pull-up transistor TPU1 and TPU2.

When the first node voltage VN1 has the first voltage level (e.g., 28 V) during the first period t1, the first and second pull-up transistor TPU1 and TPU2 may be turned on. However, when the clock signal CLK has the second voltage level (e.g., −15 V), the first and second output signals OP1(n) and OP2(n) may also have the second voltage level (e.g., −15 V). Also, when the first node voltage VN1 has the first voltage level (e.g., 28 V) and the second output signal OP2(n) has the second voltage level (e.g., −15 V), the storage capacitor Cst may store a voltage corresponding to a potential difference between the first node N1 and the second output terminal. For example, the storage capacitor Cst may be charged up to, e.g., 43 V, corresponding to a maximum potential difference between the first node N1 and the second output terminal, and may discharge a stored voltage based on a voltage level of each of the first node N1 and the second output terminal.

When the first node voltage VN1 has the second voltage level (e.g., −15 V), the second and third input transistors T2 and T3 may output the second node voltage VN2 having the first voltage level (28 V). For example, the second node N2 may receive the second driving voltage VDD2 through the second and third input transistors T2 and T3, or may have the first voltage level (e.g., 28 V) or the second voltage level (e.g., −15 V) based on the turn-on or not of the fourth discharge transistor TD4. Therefore, when the fourth discharge transistor TD4 is turned on in the first period t1, the second node voltage VN2 may be discharged, and may have the second voltage level (e.g., −15 V).

In a second period t2, because the clock signal CLK has the first voltage level (e.g., 28 V) and the first and second pull-up transistor TPU1 and TPU2 are turned on, the first and second output signals OP1(n) and OP2(n) may have the first voltage level (e.g., 28 V). Therefore, the first output part OP1 may supply the first output signal OP1(n) to another stage in the second period t2, and the second output part OP2 may supply the second output signal OP2(n) to the scan line SL in the second period t2. Accordingly, when the clock signal CLK has the first voltage level (e.g., 28 V) and the first node voltage VN1 has a voltage level that is greater than or equal to the first voltage level (e.g., 28 V), the first pull-up transistor TPU1 may output the first output signal OP1(n). Also, when the clock signal CLK has the first voltage level (e.g., 28 V) and the first node voltage VN1 has a voltage level that is greater than or equal to the first voltage level (e.g., 28 V), the second pull-up transistor TPU2 may output the second output signal OP2(n).

The first node controller NC1 may generate a bootstrapping voltage at the first node N1 in response to the second output signal OP2(n). For example, when the second output signal OP2(n) has the first voltage level (e.g., 28 V), the first node controller NC1 may increase the first node voltage VN1 by a voltage stored in the storage capacitor Cst for maintaining a potential difference between the both ends of the storage capacitor Cst. For example, the first node voltage VN1 may correspond to a sum of a level of the second output signal OP2(n) and a voltage stored in the both ends of the storage capacitor Cst. Therefore, when the level of the second output signal OP2(n) increases, the first node voltage VN1 may be bootstrapped to increase. For example, when the second output signal OP2(n) has the first voltage level (e.g., 28 V) during the second period t2, the first node voltage VN1 may have a voltage level of, e.g., 45 V, corresponding to a sum of a voltage charged into the storage capacitor Cst and the level of the second output signal OP2(n).

The first discharge transistor TD1 may be turned off in the second period t2. For example, the gate terminal of the first discharge transistor TD1 may receive the clock signal CLK having the first voltage level (e.g., 28 V) in the second period t2. However, when a gate-source voltage level of the first discharge transistor TD1 corresponds to, e.g., 0 V, the first discharge transistor TD1 may be turned off. That is, the clock signal CLK received by the gate terminal of the first discharge transistor TD1 and the first output signal OP1(n) applied to the source terminal of the first discharge transistor TD1 may each have the first voltage level (e.g., 28 V). Thus, the first discharge transistor TD1 may be turned off. When the first discharge transistor TD1 is turned off, the first node voltage VN1 may maintain, e.g., 45 V, without being discharged.

When the first output signal OP1(n) is changed from the first voltage level (e.g., 28 V) to the second voltage level (e.g., −15 V), the second discharge transistor TD2 may discharge the first node voltage VN1. For example, in a third period t3, the first output signal OP1(n) may be changed from the first voltage level (e.g., 28 V) to the second voltage level (e.g., −15 V), and the second start signal OP1(n+4) corresponding to the first output signal OP1(n+4) of the fourth rear stage may have the first voltage level (e.g., 28 V). Therefore, the second discharge transistor TD2 may discharge the first node voltage VN1 based on the second start signal OP1(n+4).

The first node voltage VN1 may be incrementally discharged during the third period t3. The first node voltage VN1 may be bootstrapped during the second period t2 to have a voltage level (e.g., 45 V), which is higher than the first voltage level (e.g., 28 V), and thus, may be incrementally discharged. For example, in the third period t3, the second discharge transistor TD2 may discharge the first node voltage VN1 based on the second start signal OP1(n+4). When the first node voltage VN1 is discharged, the fourth discharge transistor TD4 may be turned off.

When the first node voltage VN1 is discharged, the second node controller NC2 may turn off the fourth discharge transistor TD4 to block the discharging of the second node voltage VN2, and the second node voltage VN2 may have the first voltage level (e.g., 28 V) based on the second driving voltage VDD2. When the second node voltage VN2 has the first voltage level (e.g., 28 V), the third discharge transistor TD3 may be turned on, and may discharge the first node voltage VN1. Therefore, the second node voltage VN2 may have a voltage level opposite to the first node voltage VN1. Further, when the second node voltage VN2 has the first voltage level (e.g., 28 V), the third discharge transistor TD3, the first pull-down transistor TPD1, and the second pull-down transistor TPD2 may be turned on. The third discharge transistor TD3 may be turned on, and may discharge the first node voltage VN1, the first pull-down transistor TPD1 may be turned on, and may discharge the first output signal OP1(n), and the second pull-down transistor TPD2 may be turned on, and may discharge the second output signal OP2(n) having the first low voltage level (e.g., −15 V).

The first node voltage VN1 may be discharged through each of the first and third discharge transistors TD1 and TD3 in a fourth period t4. For example, a gate-source voltage level of each of the first and third discharge transistors TD1 and TD3 may correspond to, e.g., 43 V in the fourth period t4, and the first and third discharge transistors TD1 and TD3 may be turned on and may discharge the first node voltage VN1, which may control the second output signal OP2(n). As described above, the shift register 710 according to the present disclosure may include the first and third discharge transistors TD1 and TD3 and the plurality of paths through which the first node voltage VN1 is discharged, thereby decreasing a minimum level of the second driving voltage VDD2 for preventing a multi-output of the second output signal OP2(n) in one frame. Accordingly, the shift register 710 may enhance a recovery characteristic against a stress of a transistor. Thus, the shift register 710 may secure a multi-output margin of the second driving voltage VDD2, and may compensate for a reduction in discharge performance of the shift register 710, thereby enhancing reliability.

Moreover, the first node voltage VN1 may be discharged through the first discharge transistor TD1 or the third discharge transistor TD3 in a fifth period t5 and a sixth period t6, thereby maintaining the second voltage level (e.g., −15 V). Accordingly, the shift register 710 may prevent the multi-output of the second output signal OP2(n) in one frame.

FIGS. 5 to 8 describe driving of a stage of a shift register according to an embodiment of the present disclosure. For example, each of FIGS. 5 to 8 shows an operation of a transistor of a stage STm during each of first to fourth periods t1 to t4. For example, an operation of each of fifth and sixth periods t5 and t6 may be determined from an operation of a previous period, and thus, is not described.

Figure 5:
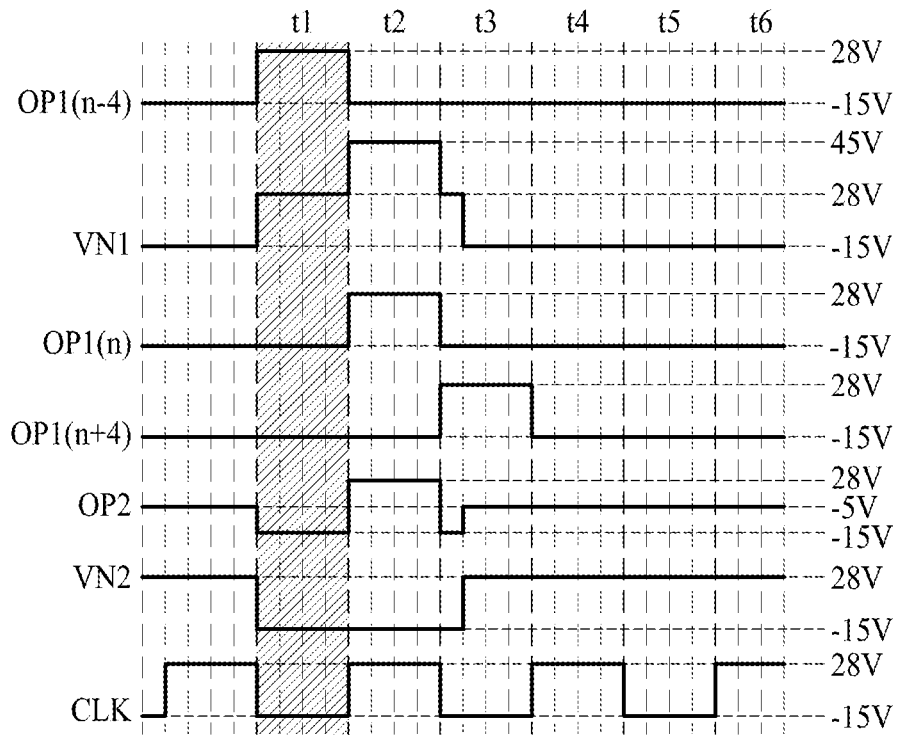
FIG. 5 illustrates a diagram describing driving of a stage of a shift register according to an embodiment of the present disclosure.
Figure 5:
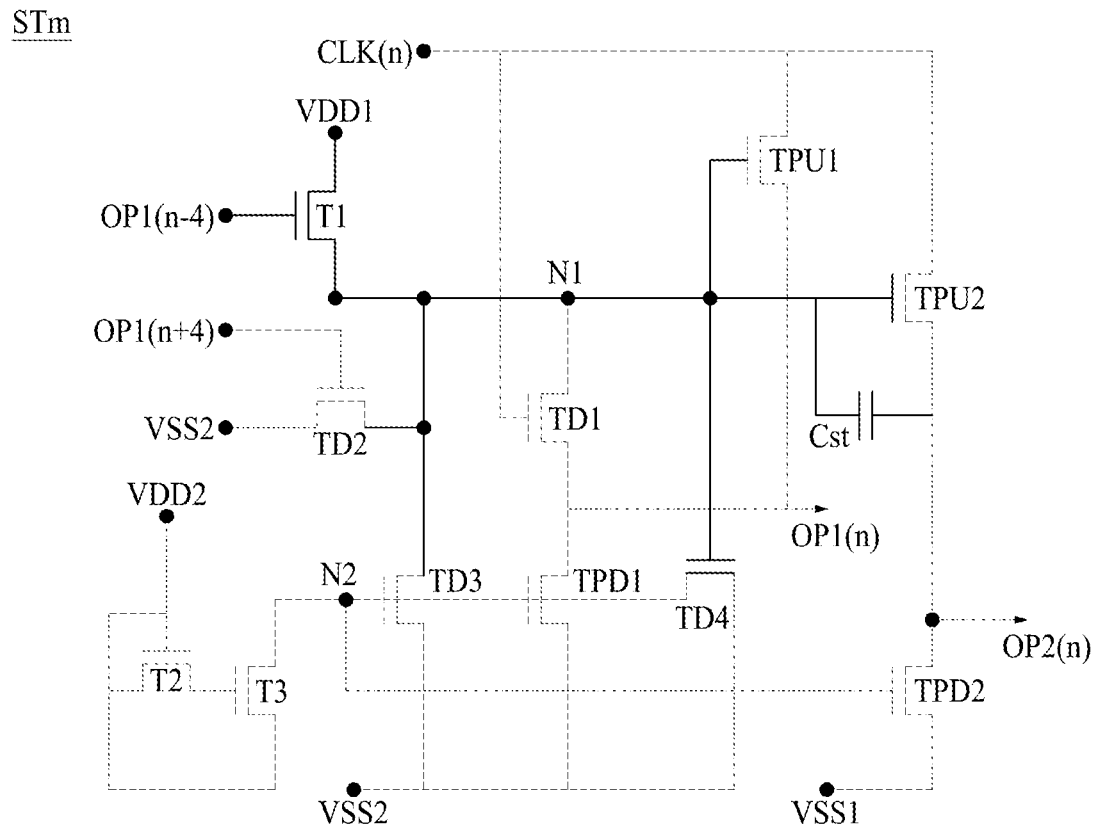

FIG. 5 illustrates a diagram describing driving of a stage of a shift register according to an embodiment of the present disclosure.

With reference to FIG. 5, a first start signal OP1(n−4) may have a first voltage level (e.g., 28 V) during a first period t1, and during the other period t1, may have a second voltage level (e.g., −15 V). A first node N1 may be connected to a source terminal of a first input transistor T1. Thus, a first node voltage VN1 may have the first voltage level (e.g., 28 V). The first node voltage VN1 may be supplied to a gate terminal of each of first and second pull-up transistors TPU1 and TPU2 and a gate terminal of a fourth discharge transistor TD4.

The gate terminal of each of the first and second pull-up transistors TPU1 and TPU2 may receive the first node voltage VN1, but when a clock signal CLK has the second voltage level (e.g., −15 V) in the first period t1, a first output signal OP1(n)) and a second output signal OP2(n) may have the second voltage level (e.g., −15 V). Also, the fourth discharge transistor TD4 may be turned on, and may discharge a second node voltage VN2. Accordingly, the second node voltage VN2 may have a voltage opposite to the first node voltage VN1. Also, the first node voltage VN1 may be changed into a storage capacitor Cst.

Figure 6:
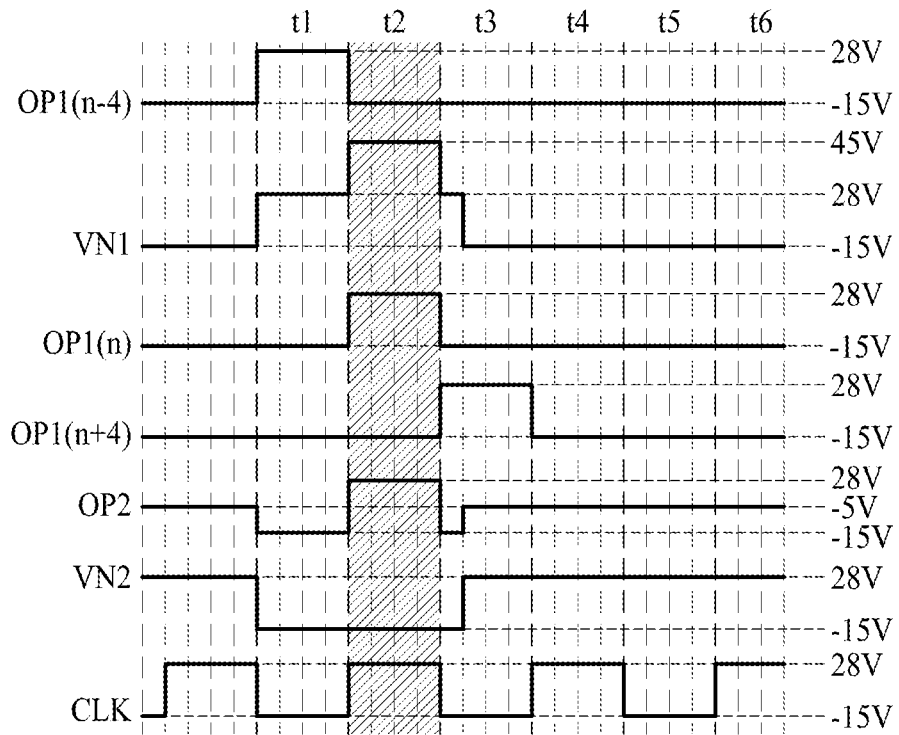
FIG. 6 illustrates a diagram describing driving of a stage of a shift register according to an embodiment of the present disclosure.
Figure 6:
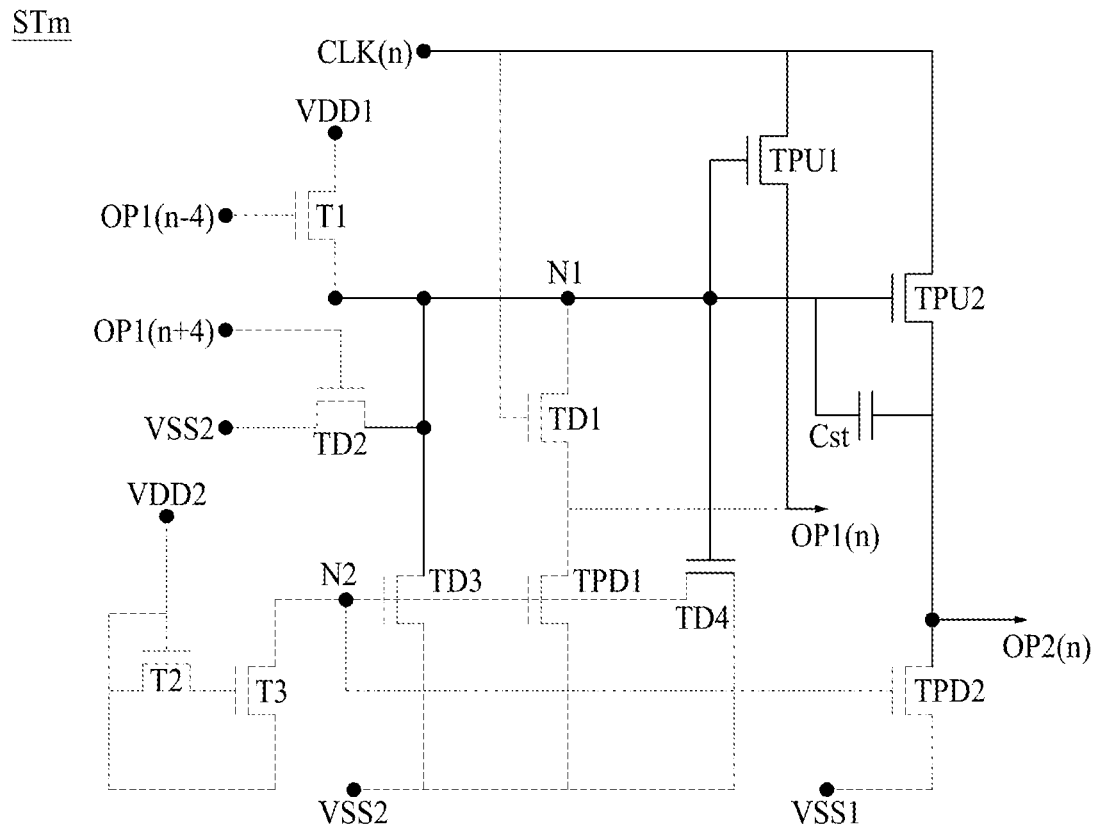

FIG. 6 illustrates a diagram describing driving of a stage of a shift register according to an embodiment of the present disclosure.

With reference to FIG. 6, a first node controller NC1 may generate a bootstrapping voltage at a first node N1 in response to the second output signal OP2(n). For example, in a second period t2, when a clock signal CLK has the first voltage level (e.g., 28 V) and the first and second pull-up transistor TPU1 and TPU2 are turned on, the first and second output signals OP1(n) and OP2(n) may have the first voltage level (e.g., 28 V). Therefore, a first output part OP1 may supply the first output signal OP1(n) to another stage in the second period t2, and a second output part OP2 may supply the second output signal OP2(n) to a scan line SL in the second period t2. At this time, when the second output signal OP2(n) has the first voltage level (e.g., 28 V), the first node controller NC1 may increase the first node voltage VN1 by a voltage stored in the storage capacitor Cst for maintaining a potential difference between both ends of the storage capacitor Cst. Accordingly, when a level of the second output signal OP2(n) increases, the first node voltage VN1 may be bootstrapped and may increase up to e.g., 45 V.

The fourth discharge transistor TD4 may be turned on, and may discharge the second node voltage VN2. Therefore, the second node voltage VN2 may have a voltage level opposite to that of the first node voltage VN1.

Figure 7:
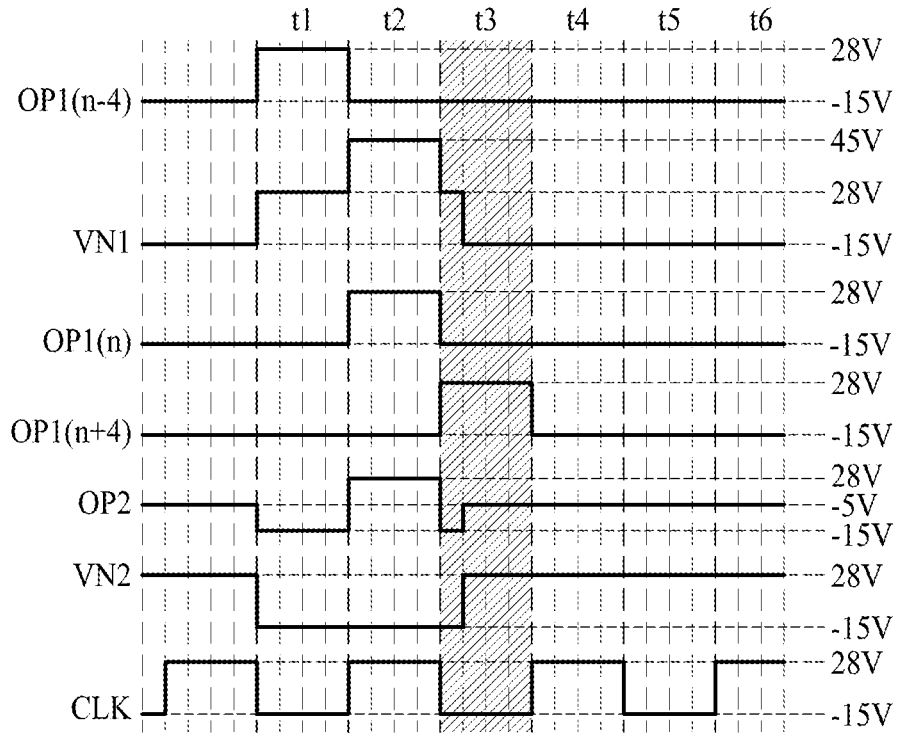
FIG. 7 illustrates a diagram describing driving of a stage of a shift register according to an embodiment of the present disclosure.
Figure 7:
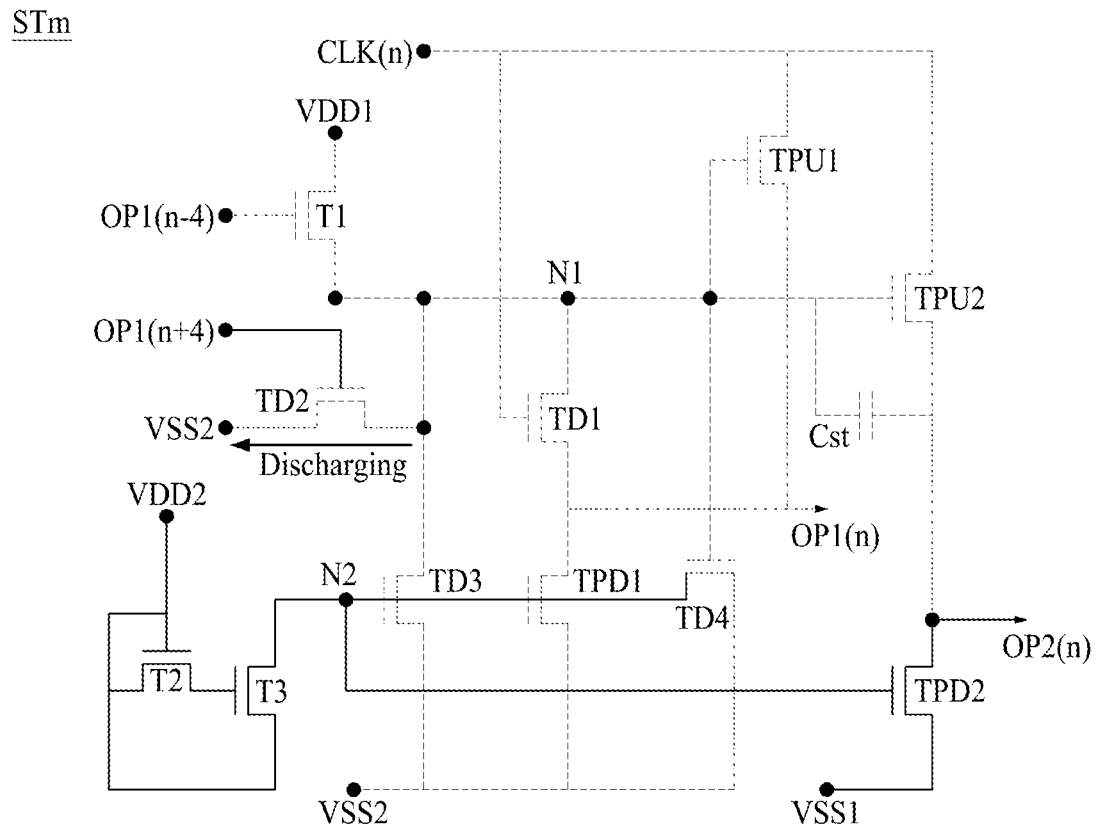

FIG. 7 illustrates a diagram describing driving of a stage of a shift register according to an embodiment of the present disclosure.

With reference to FIG. 7, in a third period t3, a second discharge transistor TD2 may discharge the first node voltage VN1 based on a second start signal OP1(n+4). For example, when the first output signal OP1(n) is changed from the first voltage level (e.g., 28 V) to the second voltage level (e.g., −15 V), the second discharge transistor TD2 may discharge the first node voltage VN1. For example, in the third period t3, the first output signal OP1(n) may be changed from the first voltage level (e.g., 28 V) to the second voltage level (e.g., −15 V), and the second start signal OP1(n+4) may have the first voltage level (e.g., 28 V). Accordingly, the second discharge transistor TD2 may discharge the first node voltage VN1 based on the second start signal OP1(n+4).

The first node voltage VN1 may be incrementally discharged during the third period t3. The first node voltage VN1 may be bootstrapped during a second period t2 to have a voltage level (e.g., 45 V), which is higher than the first voltage level (e.g., 28 V), and thus, may be incrementally discharged. For example, in the third period t3, the second discharge transistor TD2 may discharge the first node voltage VN1 based on the second start signal OP1(n+4). When the first node voltage VN1 is discharged, the fourth discharge transistor TD4 may be turned off.

When the first node voltage VN1 is discharged, the second node controller NC2 may turn off the fourth discharge transistor TD4 to block the discharging of the second node voltage VN2, and the second node voltage VN2 may have the first voltage level (e.g., 28 V) based on the second driving voltage VDD2. When the second node voltage VN2 has the first voltage level (e.g., 28 V), a third discharge transistor TD3 may be turned on, and may discharge the first node voltage VN1. Therefore, the second node voltage VN2 may have a voltage level opposite to the first node voltage VN1, and, when the second node voltage VN2 has the first voltage level (e.g., 28 V), the third discharge transistor TD3, a first pull-down transistor TPD1, and a second pull-down transistor TPD2 may be turned on. The third discharge transistor TD3 may be turned on, and may discharge the first node voltage VN1, the first pull-down transistor TPD1 may be turned on and may discharge the first output signal OP1(n), and the second pull-down transistor TPD2 may be turned on and may discharge the second output signal OP2(n) having the first low voltage level (e.g., −15 V).

Figure 8:
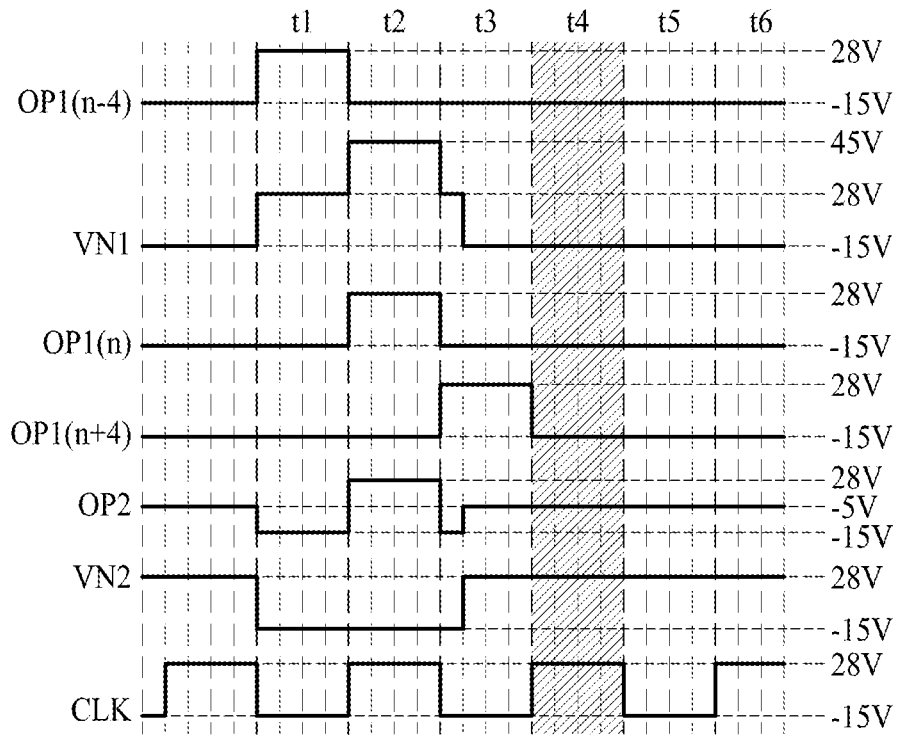
FIG. 8 illustrates a diagram describing driving of a stage of a shift register according to an embodiment of the present disclosure.
Figure 8:
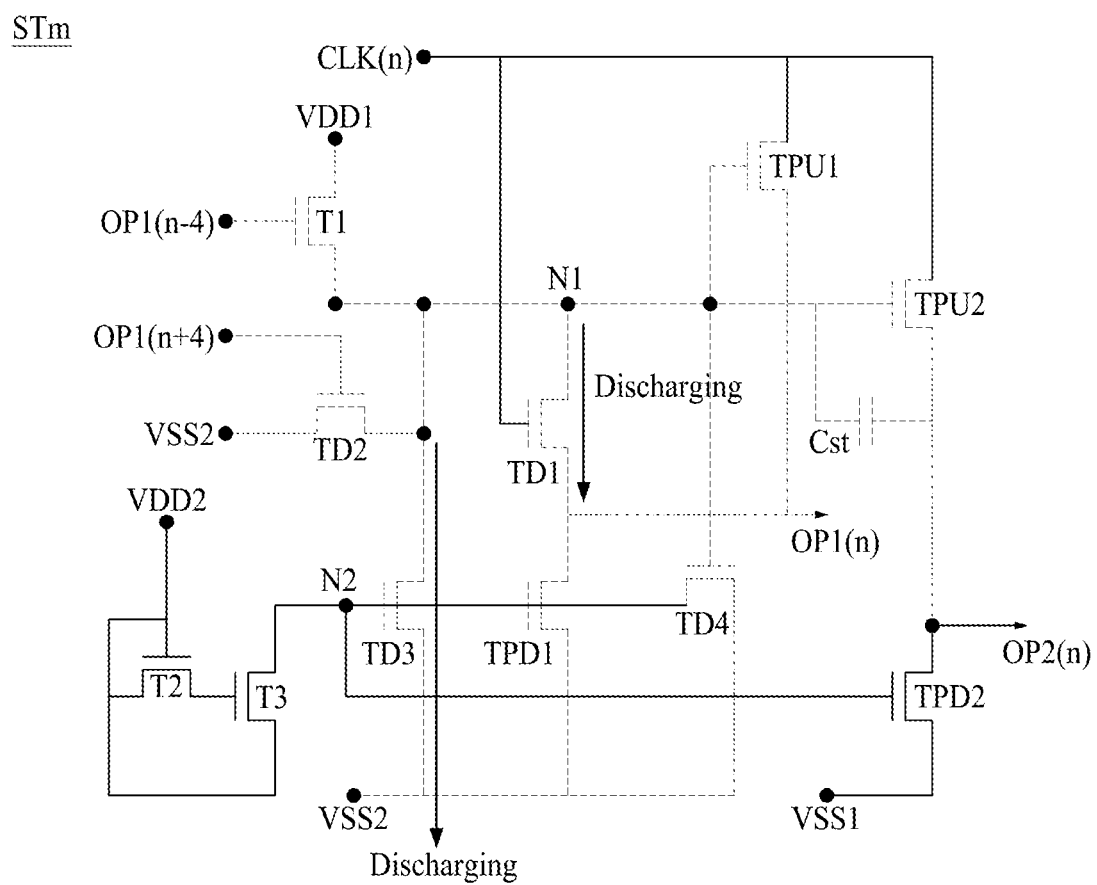

FIG. 8 illustrates a diagram describing driving of a stage of a shift register according to an embodiment of the present disclosure.

With reference to FIG. 8, the first node voltage VN1 may be discharged through each of the first and third discharge transistors TD1 and TD3 in a fourth period t4. For example, a gate-source voltage level of each of the first and third discharge transistors TD1 and TD3 may correspond to, e.g., 43 V in the fourth period t4, the first and third discharge transistors TD1 and TD3 may be turned on, and may discharge the first node voltage VN1, which may control the second output signal OP2(n). As described above, the shift register 710 according to the present disclosure may include the first and third discharge transistors TD1 and TD3 and the plurality of paths through which the first node voltage VN1 is discharged, thereby decreasing a minimum level of the second driving voltage VDD2 for preventing a multi-output of the second output signal OP2(n) in one frame. Accordingly, the shift register 710 may enhance a recovery characteristic against a stress of a transistor. Thus, the shift register 710 may secure a multi-output margin of the second driving voltage VDD2, and may compensate for a reduction in discharge performance of the shift register 710, thereby enhancing reliability.

Moreover, the first node voltage VN1 may be discharged through the first discharge transistor TD1 or the third discharge transistor TD3 in a fifth period t5 and a sixth period t6, thereby maintaining the second voltage level (e.g., −15 V). Accordingly, the shift register 710 may prevent the multi-output of the second output signal OP2(n) in one frame.

Figure 9:
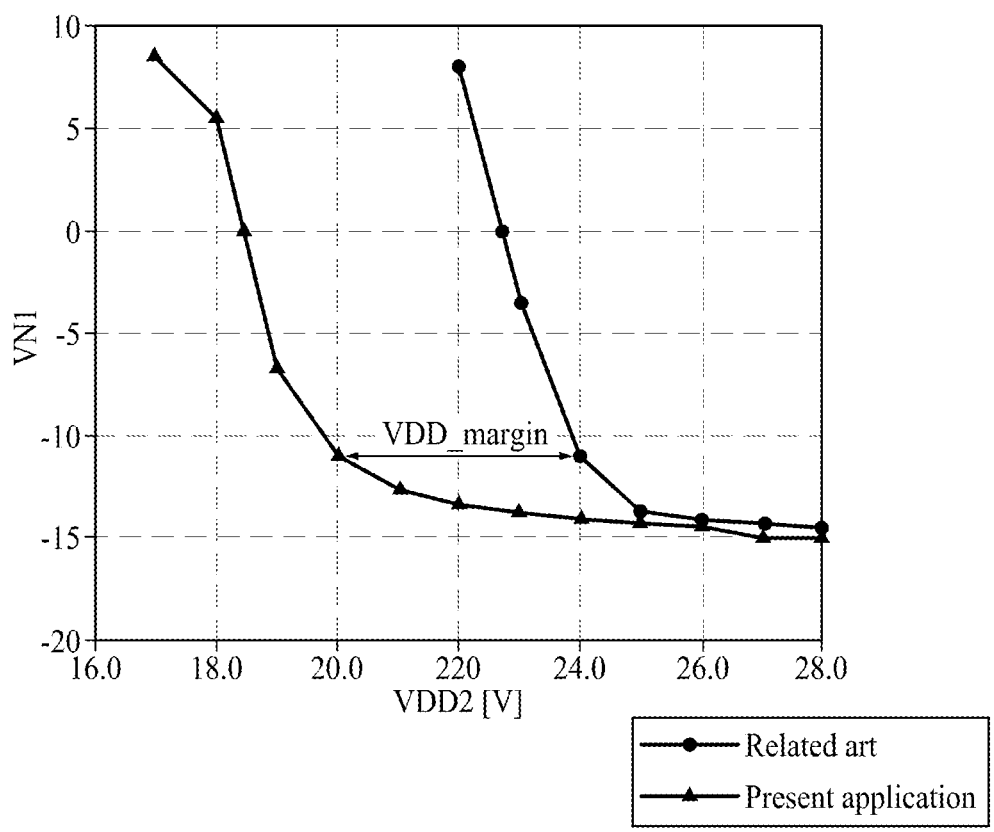
FIG. 9 illustrates a graph describing an operation of securing a multi-output margin in a shift register according to an embodiment of the present disclosure in comparison with the related art.

FIG. 9 illustrates a graph describing an operation of securing a multi-output margin in a shift register according to an embodiment of the present disclosure in comparison with the related art.

With reference to FIG. 9, in a shift register of the related art, when the second driving voltage VDD2 is, e.g., 24 V or less, the first node voltage VN1 for controlling the second output signal OP2(n) increases rapidly. Thus, there is a problem where a multi-output of the second output signal OP2(n) cannot be prevented.

On the other hand, in the shift register 710 according to an embodiment of the present disclosure, when the second driving voltage VDD2 is reduced to, e.g., 20 V or less, the first node voltage VN1 for controlling the second output signal OP2(n) may increase. For example, the second driving voltage VDD2 may prevent the multi-output of the second output signal OP2(n) in one frame based on a level; and, as a minimum level of the second driving voltage VDD2 for preventing the multi-output of the second output signal OP2(n) is reduced, a multi-output margin VDD_margin may increase in comparison with the related art. Therefore, the shift register 710 according to an embodiment may secure the multi-output margin VDD_margin of, e.g., 4 V in comparison with the related art, and may compensate for a reduction in discharge performance of the shift register 710, thereby enhancing reliability.

As a result, the shift register 710 according to an embodiment may include the first and third discharge transistors TD1 and TD3 and the plurality of paths through which the first node voltage VN1 is discharged, thereby decreasing the minimum level of the second driving voltage VDD2 for preventing the multi-output of the second output signal OP2(n) in one frame. Accordingly, the shift register 710 may enhance a recovery characteristic against a stress of a transistor. Thus, the shift register 710 may secure a multi-output margin of the second driving voltage VDD2, and may compensate for a reduction in discharge performance of the shift register 710, thereby enhancing reliability.

As described above, in the shift register according to an embodiment of the present disclosure, when the discharge transistor is added, the multi-output margin of the driving voltage may be secured. Moreover, in the shift register according to an embodiment of the present disclosure, when the path for discharging the node voltage is added by adding the discharge transistor, a reduction in discharge performance of the shift register may be compensated for, thereby enhancing reliability. Moreover, in the shift register according to an embodiment of the present disclosure, when the discharge transistor is added, a recovery characteristic against a stress of a transistor may be enhanced, thereby securing a multi-output margin.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A shift register comprising a plurality of stages, each of the plurality of stages comprising:
    a node controller configured to:
        charge a first node voltage generated from a first driving voltage;
        control a second node voltage opposite to the first node voltage based on a second driving voltage;

periodically discharge the first node voltage during a first voltage level of a clock signal having the first voltage level and a second voltage level lower than the first voltage level; and discharge the first node voltage based on the second node voltage; and an output part configured to receive the clock signal to output an output signal corresponding to one of the clock signal and a first low voltage level based on the first node voltage, wherein the output signal includes the first voltage level, the second voltage level, and the first low voltage level, and wherein the output signal includes:
a first output period having the second voltage level,
a second output period having the first voltage level,
a fourth output period having the first low voltage level, and
a third output period having the second voltage level between the second output period and the fourth output period.

2. The shift register of claim 1, wherein:
the second voltage level of the first output period varies from the first low voltage level of the fourth output period;
the first voltage level of the second output period varies from the second voltage level of the first output period;
the second voltage level of the third output period varies from the first voltage level of the second output period; and
the first low voltage level of the fourth output period varies from the second voltage level of the third output period.

3. The shift register of claim 1, wherein the node controller comprises:
a first node controller configured to receive the first driving voltage to control the first node voltage based on a first start signal; and
a second node controller configured to receive the second driving voltage to control the second node voltage based on the second driving voltage.

4. The shift register of claim 3, wherein the output part comprises:
a first output part configured to receive the clock signal to supply a first output signal to another stage based on the first node voltage; and
a second output part configured to receive the clock signal to supply a second output signal to a scan line based on the first node voltage.

5. The shift register of claim 4, wherein the first node controller comprises:
a first input transistor configured to receive the first driving voltage to output the first node voltage based on the first start signal; and
a first discharge transistor configured to discharge the first node voltage based on the clock signal.

6. The shift register of claim 5, wherein, when the clock signal has the first voltage level and the first output signal has the first voltage level, the first discharge transistor is further configured to periodically discharge the first node voltage.

7. The shift register of claim 5, wherein the first node controller further comprises a second discharge transistor configured to discharge the first node voltage based on a second start signal.

8. The shift register of claim 7, wherein, when the first output signal is changed from the first voltage level to the second voltage level lower than the first voltage level, the second discharge transistor is further configured to discharge the first node voltage.

9. The shift register of claim 4, wherein the second node controller comprises:
a second input transistor and a third input transistor configured to receive the second driving voltage to output the second node voltage;
a third discharge transistor configured to discharge the first node voltage based on the second node voltage; and
a fourth discharge transistor configured to discharge the second node voltage based on the first node voltage.

10. The shift register of claim 9, wherein:
the second input transistor configured to receive the second driving voltage to output an input node voltage based on the second driving voltage; and
the third input transistor configured to receive the second driving voltage to output the second node voltage based on the input node voltage.

11. The shift register of claim 9, wherein, when the first node voltage has a second voltage level lower than the first voltage level, the second and third input transistors are further configured to output the second node voltage having the first voltage level.

12. The shift register of claim 4, wherein the first output part comprises:
a first pull-up transistor configured to output the first output signal based on the first node voltage; and
a first pull-down transistor configured to discharge the first output signal based on the second node voltage.

13. The shift register of claim 12, wherein, when the clock signal has the first voltage level and the first node voltage has a voltage level equal to or higher than the first voltage level, the first pull-up transistor is further configured to output the first output signal.

14. The shift register of claim 4, wherein the second output part comprises:
a second pull-up transistor configured to output the second output signal having a first voltage level based on the first node voltage; and
a second pull-down transistor configured to output the second output signal having the first low voltage level based on the second node voltage.

15. The shift register of claim 14, wherein, when the clock signal has the first voltage level and the first node voltage has a voltage level equal to or higher than the first voltage level, the second pull-up transistor is further configured to output the second output signal.

16. The shift register of claim 14, wherein the first node controller further comprises a storage capacitor connected in parallel to:
a gate terminal of the second pull-up transistor; and
a source terminal of the second pull-up transistor.

17. The shift register of claim 16, wherein, when the second output signal has the first voltage level, the first node controller is further configured to increase the first node voltage by a voltage stored in the storage capacitor, for maintaining a potential difference between both ends of the storage capacitor.

18. A display apparatus, comprising:
a pixel array part comprising a plurality of pixels respectively provided in a plurality of areas defined by a plurality of scan lines and a plurality of data lines;
a data driving circuit configured to supply a data signal to each of the plurality of data lines; and a scan driving circuit configured to supply a scan signal to each of the plurality of scan lines, the scan driving circuit comprising a shift register comprising a plurality of stages, each of the plurality of stages comprising:
   a node controller configured to:
      charge a first node voltage generated from a first driving voltage;
      control a second node voltage opposite to the first node voltage based on a second driving voltage;
      periodically discharge the first node voltage during a first voltage level of a clock signal having the first voltage level and a second voltage level lower than the first voltage level; and
      discharge the first node voltage based on the second node voltage; and
   an output part configured to receive the clock signal to output an output signal corresponding to one of the clock signal and a first low voltage level based on the first node voltage,
wherein the output signal includes the first voltage level, the second voltage level, and the first low voltage level, and
wherein the output signal includes:
   a first output period having the second voltage level,
   a second output period having the first voltage level,
   a fourth output period having the first low voltage level, and
   a third output period having the second voltage level between the second output period and the fourth output period.

19. The display apparatus of claim 18, wherein:
the node controller comprises:
   a first node controller configured to receive the first driving voltage to control the first node voltage based on a first start signal; and
   a second node controller configured to receive the second driving voltage to control the second node voltage based on the second driving voltage; and
the first start signal is a first output signal output from an $(n-4)^{th}$ stage.

20. The display apparatus of claim 19, wherein:
the output part comprises:
   a first output part configured to receive the clock signal to supply a first output signal to another stage based on the first node voltage; and
   a second output part configured to receive the clock signal to supply a second output signal to a scan line based on the first node voltage; and
a second start signal is a first output signal output from an $(n+4)^{th}$ stage.

21. The display apparatus of claim 20, wherein each of the plurality of stages is configured to receive the first and second start signals to supply each of the first output signal and the second output signal once in one frame.

* * * * *